United States Patent
Löcklin et al.

(10) Patent No.: US 9,142,937 B2
(45) Date of Patent: Sep. 22, 2015

(54) WAVELENGTH REFERENCING BY MONITORING A VOLTAGE ACROSS A LASER DIODE

(71) Applicant: JDSU Deutschland GmbH, Eningen (DE)

(72) Inventors: Eberhard Löcklin, Reutlingen (DE); Georg Rudolph, Tubingen (DE); Jörg Stooss, Engstingen (DE)

(73) Assignee: JDS Uniphase Corporation, Milpitas, CA (US)

( * ) Notice: Subject to any disclaimer, the term of this patent is extended or adjusted under 35 U.S.C. 154(b) by 0 days.

(21) Appl. No.: 14/640,534

(22) Filed: Mar. 6, 2015

(65) Prior Publication Data

US 2015/0185078 A1    Jul. 2, 2015

Related U.S. Application Data (63) Continuation of application No. 13/484,104, filed on May 30, 2012, now Pat. No. 8,976,826.

(60) Provisional application No. 61/491,781, filed on May 31, 2011.

(51) Int. Cl.
| | | |
|---|---|---|
| H01S 5/068 | (2006.01) |
| G01J 3/28 | (2006.01) |
| H01S 5/00 | (2006.01) |
| H01S 5/125 | (2006.01) |
| H01S 5/32 | (2006.01) |
| G01K 7/01 | (2006.01) |
| G01J 3/10 | (2006.01) |
| H01S 5/0683 | (2006.01) |
| H01S 5/0687 | (2006.01) |

(52) U.S. Cl.
CPC ............ *H01S 5/06808* (2013.01); *G01J 3/10* (2013.01); *G01J 3/28* (2013.01); *G01K 7/01* (2013.01); *H01S 5/0014* (2013.01); *H01S 5/0683* (2013.01); *H01S 5/0687* (2013.01); *H01S 5/125* (2013.01); *H01S 5/32* (2013.01); *G01J 2003/2866* (2013.01)

(58) Field of Classification Search
CPC . H01S 5/0014; H01S 5/06808; H01S 5/0683; H01S 5/0687

See application file for complete search history.

(56) References Cited

U.S. PATENT DOCUMENTS

| | | | |
|---|---|---|---|
| 7,052,180 B2 | 5/2006 | Shih | 374/178 |
| 2004/0052299 A1 | 3/2004 | Jay et al. | 374/183 |

FOREIGN PATENT DOCUMENTS

WO    0250515    6/2002    ............ G01N 21/39

*Primary Examiner* — Armando Rodriguez
(74) *Attorney, Agent, or Firm* — Matthew A. Pequignot; Pequignot & Myers LLC (57) ABSTRACT

A lasing wavelength of a laser diode is determined by applying a forward current to the p-n junction of the laser diode and measuring a voltage across the p-n junction. The lasing wavelength can be determined by performing a simple wavelength calibration of the laser diode. This allows one to stabilize the lasing wavelength, and also to use the laser diode as a reference wavelength source.

10 Claims, 4 Drawing Sheets

WAVELENGTH REFERENCING BY MONITORING A VOLTAGE ACROSS A LASER DIODE

CROSS-REFERENCE TO RELATED APPLICATIONS

The present invention is a continuation application of U.S. patent application Ser. No. 13/484,104, filed on May 30, 2012, which claims priority from U.S. Provisional Patent Application No. 61/491,781 filed May 31, 2011, which are incorporated herein by reference.

TECHNICAL FIELD

The present invention relates to optical metrology, and in particular to wavelength referencing of optical devices.

BACKGROUND OF THE INVENTION

Many optical devices and sensors operate by sending a beam of light at a known wavelength, and the information collected by these devices and sensors depends on the wavelength being precisely known or, for some devices, stable in time. The wavelength-selective optical devices undergo mechanical drifts due to thermal gradients and aging, and thus a periodic wavelength referencing or calibration is required. By way of example, laboratory-grade optical spectrum analyzers (OSA) require periodic wavelength calibration to maintain the absolute wavelength accuracy stated in the OSA operation manual.

A wavelength calibration typically involves using an optical element having a known spectral property, such as an absorption gas cell having known absorption peaks, or a reference light source emitting light of a known wavelength. The reference light sources must provide light at a stable, or at least precisely known, wavelength(s). They have evolved from sources traditionally used in spectroscopy, such as inductively-coupled alkali-metal plasma cells, to more recently used reference laser sources.

A variety of reference laser sources are known. By way of example, Helium-Neon lasers emit light at a wavelength of 632.8 nm. One can also use a fiber-coupled laser diode having an external fiber Bragg grating as an optical feedback element to provide a reference light source at wavelengths ranging from visible to near-infrared. To increase the wavelength accuracy of a semiconductor reference laser source, some form of thermal stabilization is usually required.

The simplest approach is to stabilize the temperature of the laser diode itself. This is achieved by placing the laser diode on a heat sink coupled to a thermoelectric cooler (TEC) element, measuring the temperature of the laser diode, and providing a feedback to the TEC element to stabilize the temperature of the laser diode. The wavelength stability of this approach is limited by a fluctuation of a temperature difference between the point of measurement of the temperature, which is usually located somewhere on the laser's packaging, and the semiconductor chip of the laser diode. The temperature difference depends on such parameters as thermal resistance between the semiconductor chip and the laser's package, and amount of heat supplied to the laser diode by the driving current.

A thermistor or a thermocouple are typically used to measure the laser diode temperature. It is also noted that Jay et al. in US Patent Application Publication 2004/0052299, and Shih in U.S. Pat. No. 7,052,180 have shown that a voltage drop across a semiconductor junction of a photodiode and a light-emitting diode, respectively, can be used to measure temperature of the semiconductor junction.

An incumbent approach to increasing wavelength stability and precision of a temperature-controlled laser diode has been to couple the laser diode to a so-called wavelength locker, for example to a temperature-stabilized Fabry-Perot etalon. When a lasing wavelength of the laser diode deviates from a set wavelength, the wavelength locker provides a feedback signal to a control circuit that changes the temperature of the laser diode to reduce the wavelength deviation. Detrimentally, this approach is rather complex and costly; it is limited by the precision and stability of the wavelength locker.

The prior art is lacking a simple and inexpensive reference laser source for emitting light at a precisely known wavelength.

SUMMARY OF THE INVENTION

According to the invention, the lasing wavelength of a laser diode is determined by applying a forward current to the p-n junction of the laser diode and measuring a resulting voltage across the p-n junction. The lasing wavelength depends on the temperature of the semiconductor chip of the laser diode, which is approximately equal to the temperature of the p-n junction. The temperature of the p-n junction can be determined by measuring the voltage across the diode when the forward current is applied to the laser diode. Thus, the laser diode junction is used as a temperature-sensitive element to sense its own temperature. The actual temperature of the laser diode junction needs not be known, however; the lasing wavelength can be determined by performing a simple wavelength calibration of the laser diode. Using the laser diode p-n junction as its own temperature-dependent wavelength sensor greatly increases the accuracy of wavelength determination, so that stabilization of the laser diode temperature ceases to be a mandatory requirement.

In a preferred embodiment, the current applied to the laser diode for measuring the voltage is a below-threshold forward current, so that the laser diode does not lase during the voltage measurement, although some amplified spontaneous emission may occur during the voltage measurement.

In accordance with the invention, there is provided a method for calibrating a laser diode having a p-n junction, the method comprising:
(i) causing the laser diode to emit light by supplying a driving current above a lasing threshold of the laser diode;
(ii) determining a wavelength of the light emitted in step (i);
(iii) upon completion of step (ii), reducing the driving current below the lasing threshold;
(iv) upon completion of step (iii), determining a dark voltage across the laser diode;
(v) associating the dark voltage determined in step (iv) with the wavelength determined in step (ii) to obtain a first calibrating point;
(vi) repeating steps (i) to (v) at a different temperature of the p-n junction of the laser diode to obtain a second calibrating point; and
(vii) determining a functional relationship between the dark voltage and the wavelength based on the first and second calibrating points and a model function.

Herein, the term "driving current" refers to forward current applied to the laser diode, regardless of whether it is above or below the lasing threshold. A linear function is preferably used as the model function.

In accordance with the invention, there is further provided a method for determining a lasing wavelength of the laser diode, comprising:
(a) calibrating the laser diode by determining a dependence of a lasing wavelength when a driving current is supplied to the laser diode at a first value above a lasing threshold of the laser diode, on a voltage across the laser diode at a second value of the driving current below the lasing threshold, wherein the voltage is measured after the driving current has been reduced from the first value to the second value;
(b) causing the laser diode to emit light by supplying a driving current at a first value above the lasing threshold;
(c) upon completion of step (b), reducing the driving current to a second value below the lasing threshold;
(d) upon completion of step (c), measuring a first voltage across the laser diode; and
(e) determining a wavelength of the light emitted in step (b) by using the first voltage as an argument in the dependence determined in step (a).

In step (a), the above calibration method can be used, so that the wavelength of the light emitted in step (b) can be determined by using the first voltage as an argument in the functional relationship determined in the step (vii) above.

The lasing wavelength can be stabilized by repeatedly determining a lasing wavelength using the above method, and adjusting a temperature of the laser diode so as to stabilize the lasing wavelength; or simply by repeatedly determining the dark voltage, and adjusting a temperature of the laser diode so as to lessen a variation of the dark voltage. The lasing wavelength will be stabilized automatically. Once the lasing wavelength is stabilized, the laser diode can be used to stabilize a wavelength selective device such as an optical spectrum analyzer. The exact lasing wavelength needs not be known, if what is required is merely the wavelength stabilization.

In accordance with another aspect of the invention, there is provided a method for stabilizing a lasing wavelength of a laser diode, comprising:
(I) causing the laser diode to emit light by supplying a driving current above a lasing threshold of the laser diode;
(II) upon completion of step (I), reducing the driving current below the lasing threshold;
(III) upon completion of step (II), determining a dark voltage across the laser diode;
(IV) repeating steps (I) to (III) at a same time interval between steps (II) and (III) and adjusting a temperature of the laser diode so as to lessen a variation of the dark voltage determined in step (III).

In accordance with another aspect of the invention, there is further provided a method for calibrating a wavelength selective device, comprising:
(A) optically coupling a laser diode to the wavelength selective device;
(B) determining a lasing wavelength of the laser diode using any of the above methods;
(C) causing the wavelength selective device to select the light emitted in step (b), to determine a parameter corresponding to the selected light; and
(D) associating the parameter determined in step (C) with the wavelength determined in step (B).

In accordance with another aspect of the invention, there is further provided a controller for a laser diode, comprising:
a current source for providing a driving current to the laser diode;
a voltmeter for measuring a voltage across the laser diode; and
a control circuit coupled to the current source and the voltmeter, the control circuit suitably configured for:

(i) causing the current source to supply a driving current to the laser diode above a lasing threshold of the laser diode to emit light at a first wavelength;
(ii) causing the current source to supply a driving current to the laser diode below the lasing threshold of the laser diode;
(iii) causing the voltmeter to measure a dark voltage across the laser diode when the driving current is below the lasing threshold; and
(iv) computing the first wavelength from the dark voltage, by using the dark voltage as an argument in a pre-determined functional relationship between: the voltage across the laser diode when the driving current is below the lasing threshold; and a lasing wavelength of the laser diode when the driving current is above the lasing threshold.

The above laser controller can be used in a laser system comprising the laser controller and the laser diode coupled to the controller. The laser diode does not require a temperature adjusting/stabilizing element to emit light at a known wavelength, because the wavelength can be computed from the dark voltage. However, providing such a temperature adjusting element makes it possible to stabilize the wavelength of the laser diode. A thermoelectric cooler may be required, of course, simply to remove heat generated by the laser diode.

In accordance with another aspect of the invention, there is further provided an optical spectrometer comprising:
the above laser diode system;
an input port for launching an optical beam;
a wavelength selective device coupled to the input port, for selecting a sub-beam at the first wavelength out of the optical beam;
a photodetector coupled to the wavelength selective device, for detecting the selected sub-beam; and
a control module coupled to the controller of the laser diode system, to the wavelength selective device, and to the photodetector,
wherein the control module is suitably configured to calibrate the spectrometer by: causing the laser diode to emit a calibrating beam at the first wavelength, wherein the calibrating beam is coupled to the input port; causing the wavelength selective device to select the sub-beam at the first wavelength; and detecting the selected sub-beam with the photodetector.

In accordance with a more general aspect of the invention, there is provided use of a forward-bias voltage across a laser diode for determining a wavelength of light emitted by the laser diode. Preferably, the forward-bias voltage is determined when a driving current of the laser diode is below the lasing threshold after the driving current of the laser diode has been above the lasing threshold, wherein the light was emitted by the laser diode when the driving current was above the lasing threshold. When the driving current is below the lasing threshold, the resulting dark voltage dependence of the wavelength is more stable, predictable, and can be linear over a wide temperature range.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
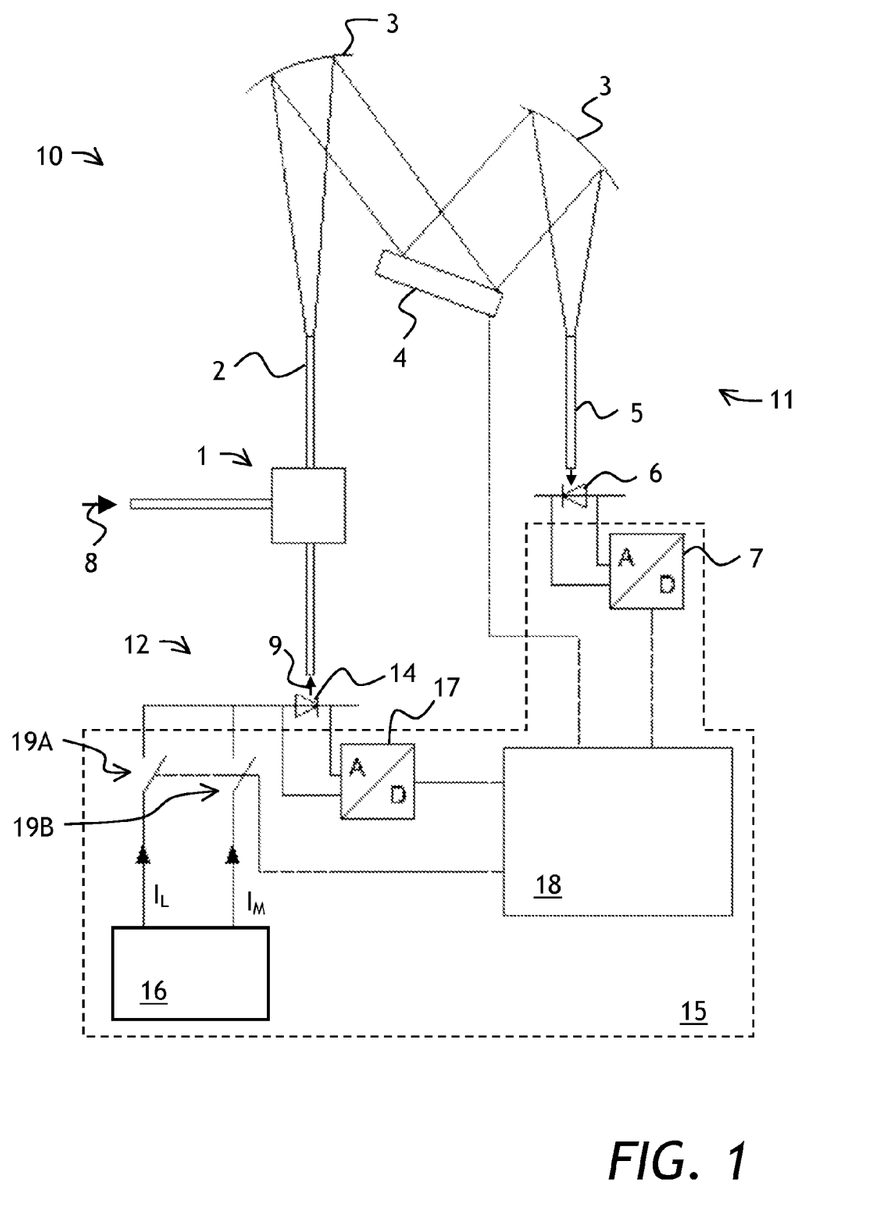
FIG. 1 is a schematic view of a spectrometer coupled to a laser diode system of the invention.

Referring to FIG. 1, a spectrometer system 10 includes a scanning optical spectrometer 11 coupled to a laser diode system 12 of the invention. The scanning optical spectrometer 11 includes an input selector or combiner 1 coupled to an input waveguide 2, collimating/focusing mirrors 3, a tiltable diffraction grating 4, an output waveguide 5, a photodetector (photodiode) 6, and an analog-to-digital converter (ADC) 7 for digitizing a signal from the photodetector 6. In operation, a controller, not shown, scans the angle of tilt of the diffraction grating 4, thus scanning a wavelength of a monochromatic component of an input optical signal 8, impinging on the photodetector 6. As the wavelength is scanned, the ADC 7 digitizes the signal from the photodetector 6. A spectrum of the input optical signal 8 is obtained. The function of the input selector or combiner 1 is to couple the input waveguide 2 to the input optical signal 8 and emission 9 of a laser diode 14.

The laser diode system 12 includes the distributed-feedback (DFB) laser diode 14 coupled to a controller 15, which includes: a current source 16 for providing a driving current to the laser diode 14; an ADC 17 for measuring a voltage across the laser diode 14; and a control circuit 18 coupled to the current source 16 and the ADC 17.

Figure 2:
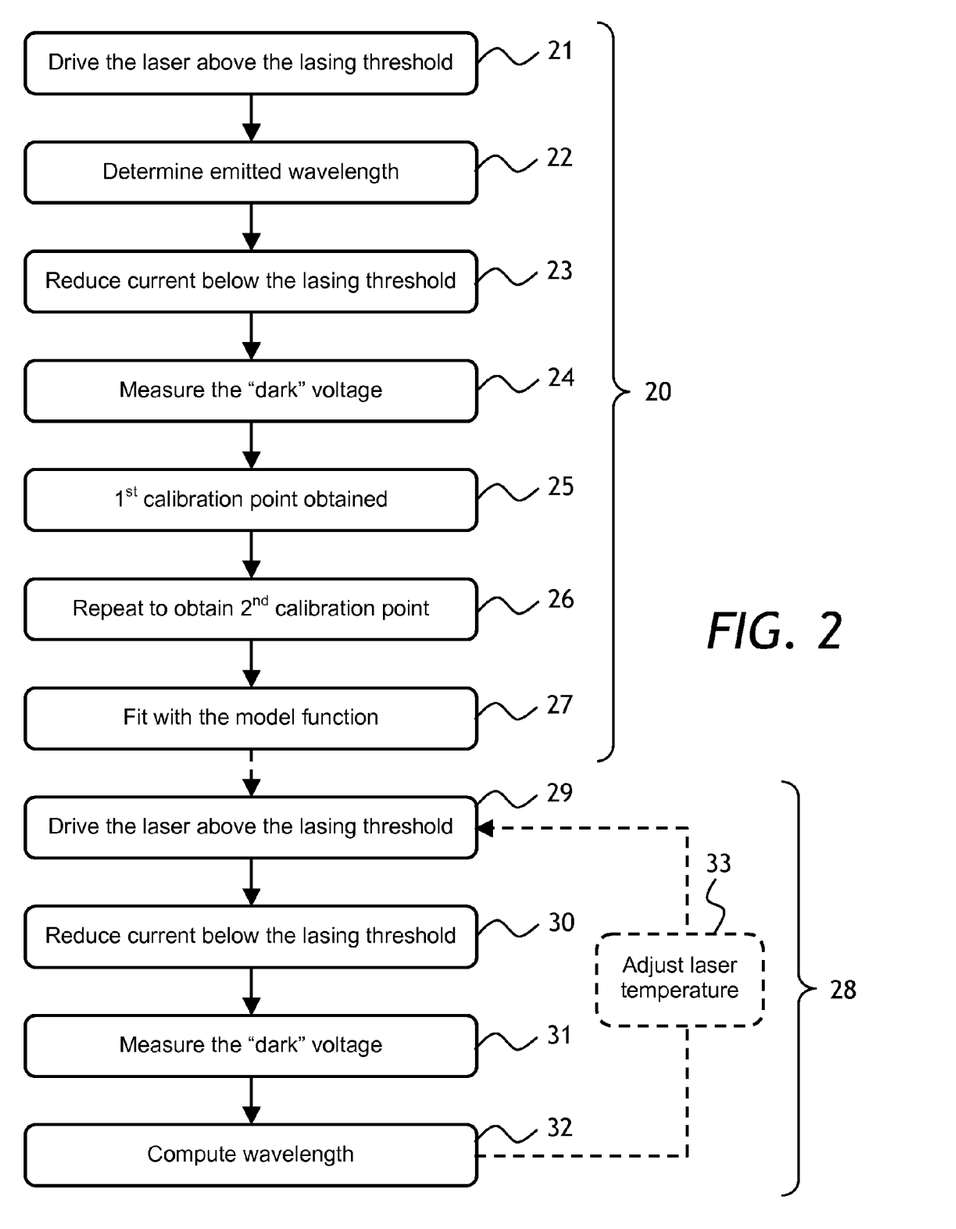
FIG. 2 is a flow chart of a method for calibrating the wavelength of the laser diode system of FIG. 1, and for determining/stabilizing the wavelength.

The laser diode 14 is calibrated as follows. Turning to FIG. 2 with further reference to FIGS. 1 and 3, the input selector 1 is switched to optically couple the laser diode 14 to the input waveguide 2 of the spectrometer 11. In a step 21 of a method 20, the control circuit 18 switches ON a lasing switch 19A for supplying a driving current 34 at a lasing magnitude $I_L$, above a lasing threshold of the laser diode 14, so that the laser diode 14 begins to emit the light 9. Then, the scanning optical spectrometer 11 begins to scan the diffraction grating 4. The photodetector 6 begins to detect light as indicated by a time trace 35. The photodetector output 35 shows a maximum at approximately −0.5 ms, corresponding to a moment when the scanning optical spectrometer 11 is tuned precisely to the emission wavelength of the laser diode 14. Shortly thereafter, the photodetector signal 35 begins to decrease, which indicates that the maximum has passed. This allows the wavelength to be determined by the spectrometer's controller in a step 22. Once the wavelength is determined, a step 23 is performed. In the step 23, the control circuit 18 switches OFF the lasing switch 19A and at the same time switches ON a measurement switch 19B for supplying the driving current 34 at a measurement magnitude $I_M$ below the lasing threshold of the laser diode 14, so that the laser diode 14 ceases to emit the light 9, although a small amount of amplified spontaneous emission may be present. The moments of performing the steps 21 to 23 are denoted in FIG. 3 with downward facing solid vertical arrows having numerals 21 to 23 above the arrows.

Figure 3:
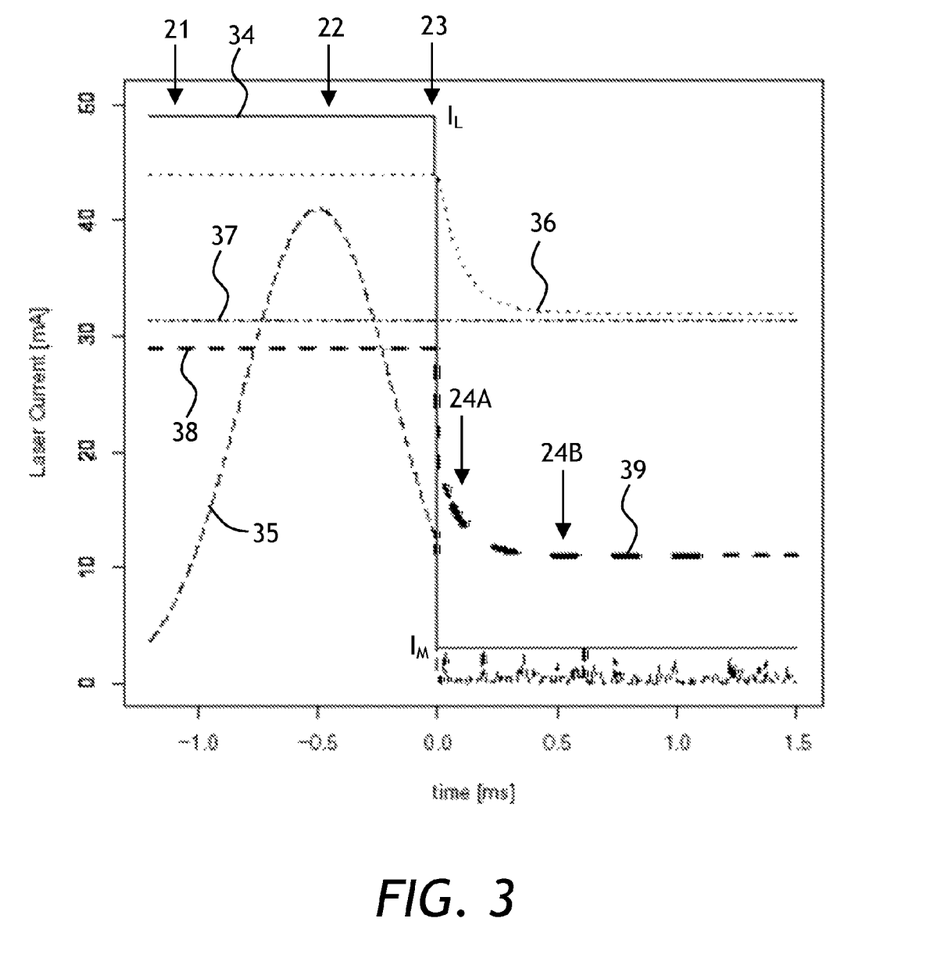
FIG. 3 is a plurality of time traces illustrating calibration of the laser diode of FIG. 1.

Once the driving current 34 is reduced to the magnitude $I_M$ below the lasing threshold, a "dark" voltage 39 across the laser diode 14 is measured by the ADC 17 in a step 24. Herein, the term "dark" is simply a name identifier, signifying that a voltage across the laser diode 14, represented by the trace 39, is measured at the driving current 34 below the lasing threshold, as explained. The dark voltage 39 can be measured at a moment 24A at about 100 microseconds, at a moment 24B at about 500 microseconds, or the entire time dependence of the dark voltage 39 from 0 microseconds onward, can be measured. Then, in a step 25, the dark voltage 39 determined in the step 24 is associated with the wavelength determined in the step 22, to obtain a first calibrating point.

To understand why the dark voltage 39 is representative of the wavelength of the emission 9 of the laser diode 14, a time evolution of the temperature of the p-n junction of the laser diode 14 will be considered. Referring again to FIG. 3, a time trace 36 denotes the time evolution of the p-n junction's temperature, and a time trace 37 denotes the package temperature of the laser diode 14. It is seen that while the package temperature 37 of the laser diode 14 is not changed, the p-n junction temperature 36 does show a relaxation over 300-400 microseconds after the driving current 34 has been reduced. As seen from FIG. 3, the p-n junction temperature 36 correlates with the dark voltage 39; this is because the dark voltage 39 is representative of the p-n junction temperature 36. Since the emission wavelength of the laser diode 14 is proportional to the p-n junction temperature 36, measuring the dark voltage 39 allows one to evaluate the emission wavelength. It is preferable to measure the dark voltage 39 as close as possible to the moment at 0.0 microseconds when the driving current 34 was reduced in step 23, preferably within 100 microseconds after the step 23, to avoid cooling down of the p-n junction. Nonetheless, it may still be possible to measure the dark voltage 39 at the point 24B when the thermal equilibrium has already been achieved. This is possible for cases where the thermal resistance between the p-n junction and the package of the laser diode 14 is small enough. For better results, one can fit the dark voltage 39 with an exponential curve to obtain the exact voltage corresponding to the temperature of the p-n junction at 0.0 microseconds when the driving current 34 was reduced in step 23. It can also be desirable to take, for every dark measurement, an average of the dark voltage 39 at the same time interval, because the offset introduced by the decay of the dark voltage 39 will be proportional to the temperature, and thus subsequently eliminated upon calibration.

In a step 26, the measurement represented by the steps 21 to 25 is repeated at a different temperature of the p-n junction, to obtain a second calibrating point. Finally, in a step 27, a functional relationship is determined between the dark voltage 39 and the wavelength based on the first and second calibrating points and a model function. The model function is a function selected to describe the dependence of the wavelength on a measured value of the dark voltage 39. It has been found that, for the temperature range of 0° C. to 60° C., the wavelength depends almost linearly on the measured value of the dark voltage 39, so that the model function can be a linear function defined by only two parameters. For a more complex model function, more than two calibration points may need to be obtained. It also can be of advantage to take more than two calibration points for fitting with a straight line.

Linear Relationship Between Wavelength and Dark Voltage

Important case of linear model function will now be considered in more detail. The relationship between the dark voltage 39 and the lasing wavelength can be deduced from Shockley equation:

$$i = I_S(e^{ue/nkT} - 1) \qquad (1)$$

wherein i is the diode current; $I_S$ is a saturation current (a constant); u is the dark voltage of the laser diode 14; e is the elementary charge; n is an emission coefficient (a constant); k is the Boltzmann constant; and T is junction temperature. The Shockley equation (1) holds very well for small diode currents and the industrial temperature range of 0° C. to 60° C.

When the current i is held constant, the exponent in (1) is constant as well, which imposes a strong linear relation between forward voltage u and temperature T:

$$u \sim T \quad (2)$$

Since the main wavelength-determining structure of a DFB laser is etched directly onto the chip, and the chip expands linearly with temperature, this linear relation holds between the wavelength $\lambda$, and the dark voltage u:

$$\lambda = S_\lambda u + \lambda_0 \quad (3)$$

wherein values $S_\lambda$ (wavelength slope) and $\lambda_0$ (base wavelength) are computed in the step 27 of determining the functional relationship using the model function, in this case the linear function (3).

The step 27 of determining the functional relationship using the linear model function (3) is performed in the following manner. The calibration points of the steps 25 and 26 are ($\lambda_1$, $U_1$) and ($\lambda_2$, $U_2$). Eq. (3) for these two calibration points records is written down as $$\lambda_1 = S_\lambda U_1 + \lambda_0$$

$$\lambda_2 = S_\lambda U_2 + \lambda_0 \quad (4)$$

Therefore, $$S_\lambda = (\lambda_2 - \lambda_1)/(U_2 - U_1)$$

$$\lambda_0 = \lambda_1 - S_\lambda U_1 \quad (5)$$

and the functional dependence in Eq. (3) is thus determined.

An Example Calibration Using the Linear Model Function

At the temperature of the p-n junction of about 23° C., with a measurement current of 2.5 mA, the first calibration point of (1506.687 nm, 0.7120126V) was measured in the step 25. At approximately 45° C. with the measurement current of 2.5 mA, the second calibration point of (1508.302 nm, 0.6758296V) was measured in the step 26. Using Eqs. (5), one obtains:

$$S_\lambda = (1508.302 - 1506.687)/(0.6758296 - 0.7120126) nm/V = -44.63146 \text{ nm}/V; \text{ and}$$

$$\lambda_0 = 1506.687 \text{ nm} + 44.63146*0.7120126 \text{ nm} = 1538.465 \text{ nm}.$$

The values of $S_\lambda$ and $\lambda_0$ are stored in the control circuit 18. The emission wavelength of the laser diode 14 can now be determined using Eq. (3). For example, at approximately 35° C., after the lasing current $I_L$ is reduced to the measurement current $I_M$, the dark voltage U has been measured to be 0.6880596V. Accordingly, the laser diode 14 has had it's power peak at:

$$\lambda = -44.63146 \text{ nm}/V*0.6880596V + 1538.465 \text{ nm} = 1507.533 \text{ nm}.$$

With a proper calibration, the error of the calibration can be less than 5 pm. The 5-pm error has been achieved using standard telecom-grade DFB lasers over a temperature range of 23° C. to 40° C. In this range, the emission wavelength of a typical DFB laser can vary over as much as 3 nm (3000 pm).

Although the calibration method 20 has been performed using the scanning optical spectrometer 11, other types of spectrometers can be used, such as detector array spectrometers, for example. Furthermore, other types of laser diodes can be calibrated, as long as a predictable, hysteresis- and hops-free dependence of the lasing wavelength on the laser diode temperature exists. The laser diodes can be cooled or uncooled.

Referring back to FIG. 1, the ADC 17 can be of any suitable type. The ADC 17 is essentially a voltmeter that measures the dark voltage across the diode 14. Any suitable current source 16 can be used. It is also to be understood that the switches 19A, 19B are shown simply to illustrate the concept of wavelength calibration using a driving current switched between two discrete values. The actual current source 16 does not have to have the switches 19A, 19B, and the current may be regulated electronically.

Once the laser diode 14 is calibrated using the method 20 or any other suitable method, a lasing wavelength of the laser diode 14 can be determined. Referring again to FIG. 2, a method 28 for determining the lasing wavelength includes a step 29 of driving the laser diode 14 above the lasing threshold, a step 30 of reducing the driving current below the driving threshold, a step 31 of measuring a first voltage across the laser diode 14, and a step 32 of computing the lasing wavelength using Eq. (3) above. Preferably, a time interval between reducing the current and measuring the dark voltage during calibration (steps 23 and 24) is substantially equal to a time interval between reducing the current and measuring the dark voltage during wavelength determination (steps 30 and 31). This allows one to improve an overall precision of determining the wavelength in the step 32, because the voltage offset introduced by measuring the voltage or mean voltage depends on the time interval in a similar way, and is cancelled out by the calibration process.

To stabilize the lasing wavelength of the laser diode 14, the wavelength determination steps 29 to 32 can be repeated, and the temperature of the laser diode 14 can be adjusted in an optional step 33, so as to lessen a variation of the lasing wavelength repeatedly determined in the step 32.

If the lasing wavelength stabilization is all that is required, the stabilization method 28 including the step 33 can be simplified. Following steps can be performed:

(I) causing the laser diode 14 to emit the light 9 by supplying a driving current above a lasing threshold of the laser diode 14;

(II) upon completion of step (I), reducing the driving current below the lasing threshold;

(III) upon completion of step (II), determining a dark voltage across the laser diode 14; and (IV) repeating steps (I) to (III) at a same time interval between steps (II) and (III) and adjusting the temperature of the laser diode 14, so as to lessen a variation of the dark voltage determined in step (III).

Once the wavelength of the laser diode is stabilized, a wavelength selective optical device can be stabilized by optically coupling the laser diode 14 to the wavelength selective optical device. The actual wavelength needs not be known if stabilization is all that is required. If a wavelength calibration is required, the actual wavelength, of course, needs to be known; but it needs not be stable, for as long as it is known. Stabilized known wavelength is the best option for calibration; but it would require a temperature control element such as a thermoelectric cooler for controlling the temperature of the laser diode 14.

When one laser source is used as described above to calibrate a wavelength sensitive instrument, then the wavelength drift of the device can be reduced. When a second laser source with a different wavelength is provided, the drift and slope of the wavelength function can also be reduced. Laser sources can also be provided for different optical bands (C-, L-Band, and so on).

In the discussion above, the scanning optical spectrometer 11 was used to calibrate the laser diode 14. In accordance with the invention, the opposite operation, that is, calibrating an optical spectrometer using the (already calibrated) laser diode 14 emitting the light 9 at a known wavelength, is also possible. In the example below, the spectrometer 11 is presumed uncalibrated; the spectrometer 11 gets calibrated assuming the laser diode 14 has been previously calibrated using some other spectrometer.

Figure 4:
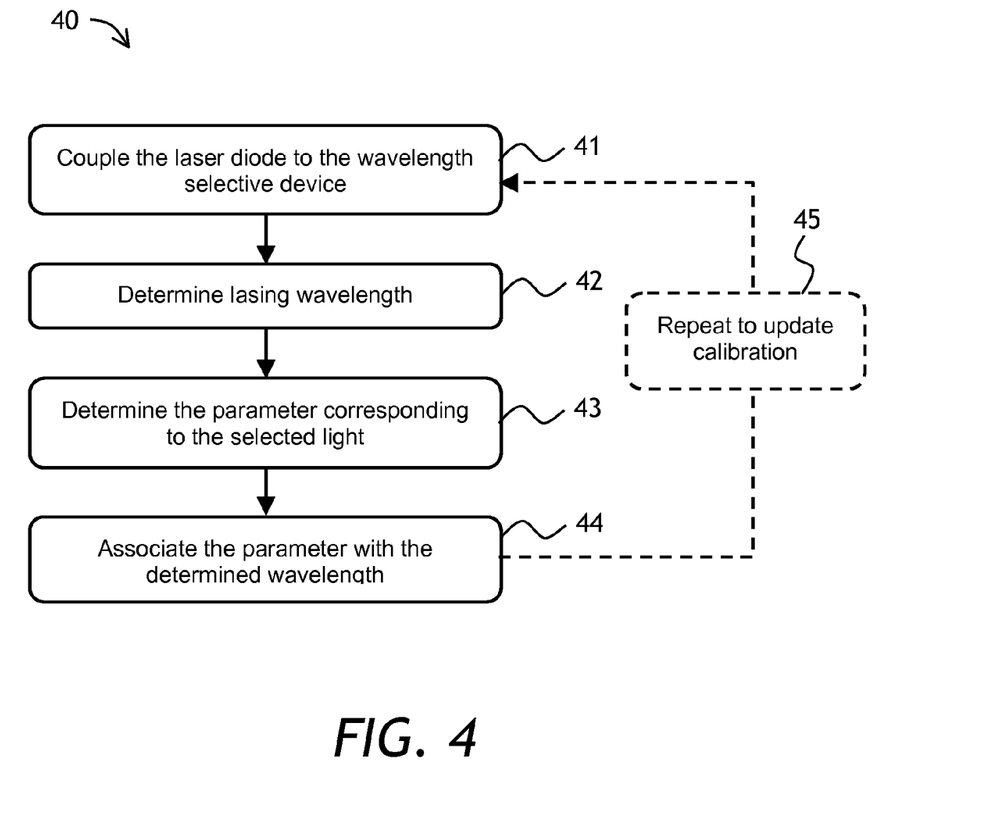
FIG. 4 is a flow chart of a method for calibrating a wavelength selective device using the laser diode system of FIG. 1.

Referring to FIG. 4 with further reference to FIGS. 1 and 2, a method 40 for calibrating the scanning optical spectrometer 11 includes a step 41 of optically coupling the laser diode 14 to the scanning optical spectrometer 11. This is done by switching the input selector 1 to select the light 9 of the laser diode 14. In a step 42 of the method 40, a lasing wavelength of the laser diode 14 is determined using the method 28 and Eq. (3). In a step 43, the scanning optical spectrometer 11 selects the light emitted in the step 29 of FIG. 2, when the driving current was above the threshold, to determine a parameter corresponding to the selected light, in this case an angle of tuning of the diffraction grating 4. In a step 44, the angle of tuning is associated with the wavelength determined in the step 42. In an optional step 45, the steps 41 to 44 are repeated, preferably periodically, to keep the scanning optical spectrometer 11 calibrated.

Other wavelength selective devices can be calibrated using the method 40. The calibration essentially consists in associating a corresponding parameter with a known wavelength. For example, for tunable Fabry Perot etalons the parameter is the etalon gap, which is dependent on the voltage applied to the piezo element that tunes the etalon; for optical spectrometers with a detector array, such as an optical wedge interferometer or a diffraction grating based polychromator, the parameter is a serial number of a detector array element that has detected the light at the known wavelength; and so on.

The calibrated diode laser system 12 can be used to stabilize and/or provide a wavelength reference for optical spectrometers adapted for use in a variety of applications, such as laboratory spectrum analyzers, optical channel monitors used in optical networks, gas sensor devices for determining chemical composition of a gas by optical spectroscopy, to name a few. Since the thermal stabilization of the laser diode 14 is not required, the laser diode system 12 can be made light, compact, and energy-efficient, warranting its use as a wavelength reference in various field-type optical instruments such as chemical sensors, spectrum analyzers, gas detectors, and so on. Gas sensors can be made cheaper by detecting the absorption wavelength with an immediate dark voltage measurement after every detected absorption line.

According to a more general aspect of the invention, a forward-bias voltage across a laser diode is used to determine the wavelength of light emitted by the laser diode. This means that the above-threshold driving currents can also be used to determine the wavelength. The advantage of using the above-threshold driving current for the forward voltage measurement is that the laser diode 14 needs not be switched OFF to measure the dark voltage. However, the above-threshold voltage measurement dependence is significantly less linear when the driving current is above the threshold, so that a more detailed and tedious calibration is required. Furthermore, at temperatures around 50° C., the dependence of the above-threshold forward voltage on the temperature can flat out, so that the sensitivity of the wavelength measurement can be significantly reduced. This is why measuring of the "dark" forward voltage, when the driving current is below the lasing threshold of the laser diode 14, is preferable.

When implemented in software, the functions of the controller 18, or the control module of the spectrometer 11 or any other spectrometer, may be stored as one or more instructions or code on a non-transitory computer-readable or processor-readable storage medium. The steps of the methods disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Additionally, the operations of a method or algorithm may reside as one or any combination or set of codes and/or instructions on a non-transitory processor-readable medium and/or computer-readable medium, which may be incorporated into a computer program product. The hardware of the controller 18 may include a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optical system comprising:
a controller for a laser diode, the controller comprising:
a current source for providing a driving current to the laser diode;
a voltmeter for measuring a voltage across the laser diode; and
a control circuit coupled to the current source and the voltmeter, the control circuit structured and arranged to:
cause the current source to supply a first driving current to the laser diode above a lasing threshold of the laser diode to emit light at a first wavelength;
cause the current source to supply a second driving current to the laser diode;
cause the voltmeter to measure a reference value of a forward-bias voltage across the laser diode when the second driving current is supplied; and
compute the first wavelength based on the reference value of the forward-bias voltage.

2. The optical system of claim 1, wherein the first wavelength is computed using a pre-determined functional relationship between: (i) the forward-bias voltage across the laser diode when the second driving current is supplied to the laser diode; and (ii) a lasing wavelength of the laser diode when the first driving current is supplied to the laser diode, wherein the reference value of the forward-bias voltage is used as an argument in the pre-determined functional relationship.

3. The optical system of claim 1, wherein the second driving current is substantially equal to the first driving current.

4. The optical system of claim 1, wherein the second driving current is above the lasing threshold.

5. The optical system of claim 1, further comprising the laser diode coupled to the controller.

6. The optical system of claim 4, wherein the laser diode is uncooled.

7. The optical system of claim 5, further comprising:
an input port for launching an optical beam;
a wavelength selective device coupled to the input port, for selecting a sub-beam at the first wavelength out of the optical beam;
a photodetector coupled to the wavelength selective device, for detecting the selected sub-beam; and
a control module coupled to the controller for the laser diode, to the wavelength selective device, and to the photodetector,
wherein the control module is structured and arranged to:
cause the laser diode to emit a calibrating beam at the first wavelength, wherein the calibrating beam is coupled to the input port,
cause the wavelength selective device to select the sub-beam at the first wavelength; and
detect the selected sub-beam with the photodetector.

8. The optical system of claim 7, wherein the optical system is structured and arranged to determine chemical composition of a gas by optical spectroscopy.

9. The optical system of claim 5, wherein the optical system is structured and arranged to provide a wavelength reference for an optical instrument.

10. The optical system of claim 9, wherein the optical instrument is an optical spectrometer.

* * * * *